US012717989B1

(12) United States Patent
Russell et al.

(10) Patent No.: US 12,717,989 B1
(45) Date of Patent: Aug. 25, 2026

(54) INTERACTIVE USER INTERFACE FOR PREDICTIVE SIMULATION RESULTS

(71) Applicant: Amazon Technologies, Inc., Seattle, WA (US)

(72) Inventors: Andrew Chester Russell, Seattle, WA (US); Abraham Cantwell, Seattle, WA (US); Thomas Tyler Parsons, Renton, WA (US)

(73) Assignee: Amazon Technologies, Inc., Seattle, WA (US)

( * ) Notice: Subject to any disclaimer, the term of this patent is extended or adjusted under 35 U.S.C. 154(b) by 1263 days.

(21) Appl. No.: 17/507,415

(22) Filed: Oct. 21, 2021

(51) Int. Cl.
*G06F 30/27* (2020.01)

(52) U.S. Cl.
CPC .................................... *G06F 30/27* (2020.01)

(58) Field of Classification Search
CPC ................................ G06F 30/20; G06F 30/27
See application file for complete search history.

(56) References Cited

U.S. PATENT DOCUMENTS 9,773,418 B1* 9/2017 Smith ...................... G08G 5/56
2017/0057664 A1* 3/2017 Soudbakhsh ........... B64F 1/368
2018/0300653 A1* 10/2018 Srinivasan .............. H04L 67/06
2020/0167437 A1* 5/2020 Mallya Kasaragod ...................... G06F 30/27
2020/0311617 A1* 10/2020 Swan .................... G06F 9/5077
2021/0110299 A1* 4/2021 Bisson-Krol ............ G06N 3/08
2022/0051157 A1* 2/2022 Smith ..................... G06F 30/27

OTHER PUBLICATIONS

Borys et al. “Selection and Optimization of the Parameters of the Robotized Packaging Process of One Type of Product” Sensors 2020, 20, 5378; doi:10.3390/s20185378 (Year: 2020).*
Mauro, F. “Towards the design of an effective and robust parcel-sorting system” [Thesis] Delft University of Technology [retrieved on Sep. 6, 2025] (Year: 2017).*

* cited by examiner

*Primary Examiner* — Emerson C Puente
*Assistant Examiner* — Alfred H B Wechselberger
(74) *Attorney, Agent, or Firm* — Eversheds Sutherland (US) LLP

(57) ABSTRACT

Disclosed are various embodiments for an interactive user interface for predictive simulation results that are derived from the automatic sampling of a simulation space. In some embodiments, a system is configured to receive a manifest and an input data object for executing a simulation project on a simulator. The system can generate sample inputs for a sample space of the simulation project based on a sampling space criteria for the simulation project. A simulation of the simulation project is executed to generate simulation outputs based on the input data object. A machine learning model can be trained based at least in part on simulation outputs. The system can be configured to generate a user interface that displays a predictive simulator output for the simulation project based on querying the machine learning model with an unsimulated input.

16 Claims, 5 Drawing Sheets

INTERACTIVE USER INTERFACE FOR PREDICTIVE SIMULATION RESULTS

BACKGROUND

Simulators can be valuable when exploring new design configurations or business ideas. A simulator can uncover potential bottlenecks or unanticipated operating states before a design configuration or business idea is implemented in the real world. However, even a simple model can have millions of potential configurations and can take hours to simulate.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

The present disclosure relates to an interactive user interface for predictive simulation results that are derived from the automatic sampling of a simulation space. Simulators can be incredibly valuable when exploring new design configurations or business ideas. A simulation can uncover potential bottlenecks or unanticipated operating states before a design configuration or business idea is implemented in the real world. Unfortunately, even a simple simulation model can have millions of potential configurations and can take hours to simulate one configuration. After a simulation is complete, the results are gathered, analyzed, and presented to the simulation customer. It can be difficult to predict the types of questions that the simulation customers may ask upon reviewing the simulation data. The simulation customers may want to change the configuration parameters of the simulation to see how the change affects the simulation results, which can lead to a time-consuming cycle of iterating through various simulation configurations.

Various embodiments of the present disclosure are directed to improved approaches that (1) reduce an amount of simulation processing required because predictive simulation results are provided; (2) provide an interactive user interface for requesting various input configurations and the user interface being updated (e.g., in real-time or near real-time) to display the predictive simulation results without having to execute a simulation of the new input configuration; (3) provide an interactive user interface that improves the experience of users that do not need a technical understanding of running a simulator; (4) provide a single interactive user interface that can either launch a simulation of a set of input parameters or generate predictive simulation results from the set of input parameters; and (5) automate a set of services for sampling a limited portion of a simulation sample space with structured data formats for input data for a simulator and output data from the simulator for displaying the simulation data; and other technical improvements. In the following discussion, a general description of the system and its components is provided, followed by a discussion of the operation of the same.

Figure 1:
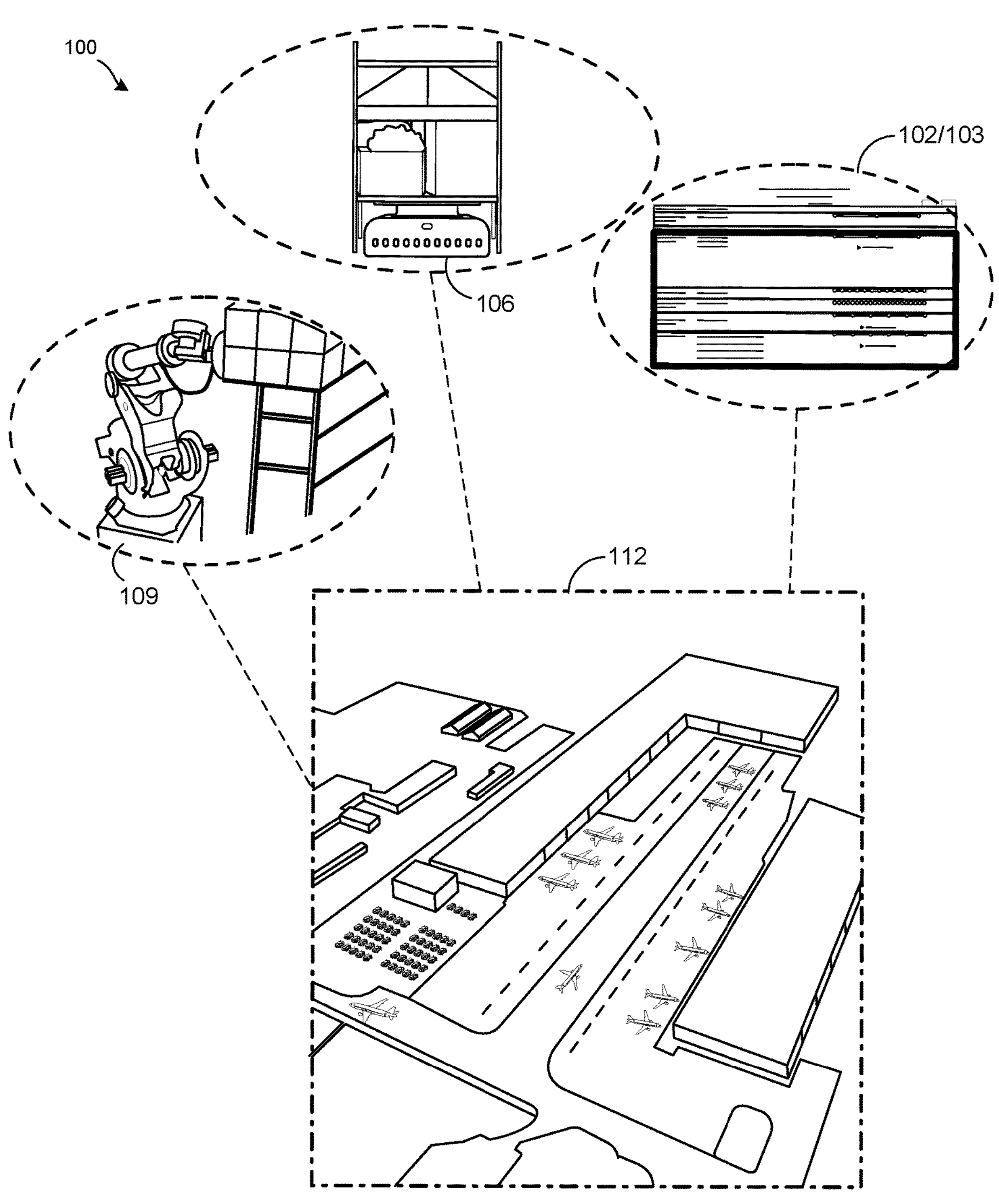
FIG. 1 is a drawing of an example scenario of a user interface used to optimize robotic devices in a facility according to various embodiments of the present disclosure.

With reference to FIG. 1, shown is a drawing of an example of air hub scenario 100 in which user interfaces (e.g., a simulation launcher use interface 102 and a configurator user interface 103) are used to optimize robotic devices (e.g., robotic movers 106, robotic arms 109) deployed in an air hub campus 112. In the depicted example scenario, the air hub campus 112 includes several large facilities that receive and ship packages from numerous airplanes. For example, an inbound airplane arrives at the air hub campus 112 with pallets of packages. The arriving packages can be scheduled to be shipped to different destinations by way of different airplanes at the air hub campus 112. Various robotic devices (e.g., robotic movers 106, robotic arms 109) can be employed to increase the efficiency of moving the packages from the arriving airplanes to different departing airplanes. For example, numerous robotic arms 109 can be used to unload the airplanes. Also, numerous robotic movers 106 can be used to move the packages from one location to another.

Several operating teams may be responsible with optimizing the operations of the air hub campus 112. The operations of the air hub campus 112 may be affected by a large variety of factors, such as a quantity of robotic movers 106 to use, a quantity of robotic arms 109 to use, which routes should a robotic mover 106 take, an amount of time for a robotic arm 109 to move a pallet of packages, an amount of prep time for a robotic arm 109, an amount of travel time for a robotic mover 106 to travel to a destination location, and other suitable factors. A simulation of one or more configurations of the various parameters can be useful to identify an optimized set of parameters.

In one embodiment, a configurator user interface 103 can be used to display predicted simulated results for an unsimulated configuration. The predicted simulated results can be derived from one or more simulated results. On the configurator user interface 103, a user can adjust the input configuration parameters and updated predicted simulated results can be displayed in real-time (or near real-time).

For example, a user may execute a simulation to determine a quantity of packages that can be processed through the air hub campus 112 in a twenty-four hour time period. Simulations may be executed for five different sets of input configurations for different quantities of robotic movers 106 and robotic arms 109. The simulated results from the five different input configurations can be used to train a machine learning model for predicting simulation results for unsimulated input configurations. Accordingly, when a user selects an input configuration that has not been simulated, the configurator user interface 103 can query the machine learning model for an updated predictive result based on the selected unsimulated input configuration. As a result, the configurator user interface 103 can display various predicted simulation results for the number of packages that can be processed without having to run a new simulation for every input configuration, which reduces the amount of simulation processing time needed.

Figure 2:
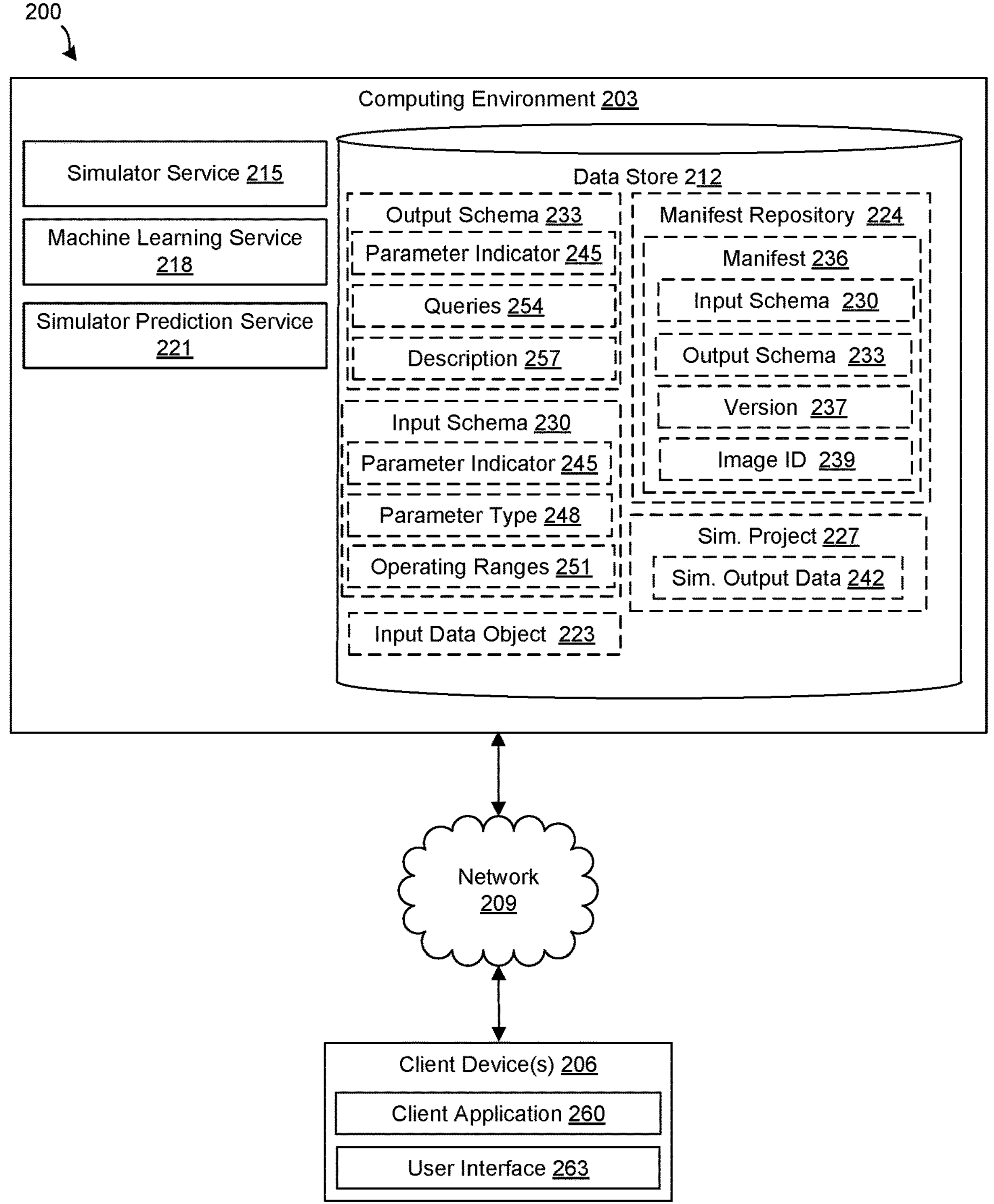
FIG. 2 is drawing of a networked environment according to various embodiments of the present disclosure.

With reference to FIG. 2, shown is a networked environment 200 according to various embodiments. The networked environment 200 includes a computing environment 203, and a client device 206, which are in data communication with each other via a network 209. The network 209 includes, for example, the Internet, intranets, extranets, wide area networks (WANs), local area networks (LANs), wired networks, wireless networks, or other suitable networks, etc., or any combination of two or more such networks. For example, such networks may comprise satellite networks, cable networks, Ethernet networks, and other types of networks.

The computing environment 203 may comprise, for example, a server computer or any other system providing computing capability. Alternatively, the computing environment 203 may employ a plurality of computing devices that may be arranged, for example, in one or more server banks or computer banks or other arrangements. Such computing devices may be located in a single installation or may be distributed among many different geographical locations. For example, the computing environment 203 may include a plurality of computing devices that together may comprise a hosted computing resource, a grid computing resource and/or any other distributed computing arrangement. In some cases, the computing environment 203 may correspond to an elastic computing resource where the allotted capacity of processing, network, storage, or other computing-related resources may vary over time.

Various applications and/or other functionality may be executed in the computing environment 203 according to various embodiments. Also, various data is stored in a data store 212 that is accessible to the computing environment 203. The data store 212 may be representative of a plurality of data stores 212 as can be appreciated. The data stored in the data store 212, for example, is associated with the operation of the various applications and/or functional entities described below.

The components executed on the computing environment 203, for example, include a simulator service 215, a machine learning service 218, a simulator prediction service 221, and other applications, services, processes, systems, engines, or functionality not discussed in detail herein. The simulator service 215 is executed to provide simulations of simulation projects. The simulator service 215 may provide simulation application programming interfaces (APIs) for receiving simulation project requests and providing simulation output data. In some embodiments, the simulator service 215 may display a simulator launch user interface on the client device 206. The simulator launch user interface can provide another method for requesting simulations and providing the input configurations.

The machine learning service 218 can be a service platform that enables for training and deploying machine learning models. The machine learning service 218 can be in data communication with other services and applications in the computing environment 203 and in data communication with the data store 212. For example, the machine learning service 218 can receive simulation data from the simulator service 215 and can use the simulation data to train machine learning models. Once trained, the models in the machine learning service 218 can be accessed by the configurator user interface 103, the simulator prediction service 221, and other applications and services in the computing environment 203.

The simulator prediction service 221 can represent various functionality at one or more stages of generating predictive simulation results. In some embodiments, the simulator prediction service 221 can automate a collection of services that enable automatic sampling of a simulation space for a simulation project 227, and the presentation of data derived from those simulations in an interactive user interface 263 (e.g., the configurator user interface 103).

The data stored in the data store 212 includes, for example, an input data object 223, a manifest repository 224, simulation projects 227, an input schema 230, an output schema 233, and potentially other data. The input data object 223 (e.g., a configuration data object) can represent a structured input configuration that is provided to the simulator service 215 for executing a simulation project 227. The input data object 223 can comprise a set of configuration parameter names and a set of parameter values for the simulation project 227. The configuration parameters included in the input data object 223 can be identified from input provided by the client device 206 (e.g., via a command line interface or a simulation launcher user interface 102).

In some examples, the input data object 223 may be a JavaScript Object Notation (JSON) or other suitable data-interchange format. The configuration in the input data object 223 can be consumable through an annotation-based domain specific language (DSL) that relies on deserialization to translate subtrees of the JSON into domain objects. The annotations will take in a JSON pointer to a subtree of the configuration, and attempt to deserialize it into an instance of the annotated type. If successful, the instance will be inserted at initialization time. If it fails, an error will be recorded and reported along with any other deserialization errors.

The manifest repository 224 can represent a repository for manifests 236, where each manifest 236 may have a unique identifier. A manifest 236 can be linked to an input schema 230, an output schema 233, a version 237, a source code image identifier 239, and other potential data. The manifest 236 can represent a published version of the structured data elements (e.g., the input schema 230, the output schema 233, the source code image identifier 239). The data elements for each manifest 236 can be accessible (e.g., via queries) by the client device 206 during various stages of the embodiments. For example, the simulator prediction service 221 can allow to a user to select a manifest 236 from the manifest repository 224 when initially launching/configuring a simulation project 227 through a user interface.

In some embodiments, the manifest 236 can also include a maintenance status, a revocation status, and other suitable data. The version 237 can represent a unique instance of a manifest. The source code image identifier 239 can represent an immutable instance of simulation source code. The simulation project 227 can represent a simulation of a set of configuration parameters executed by the simulator service 215. The simulation project 227 can be executed based on the input data object 223.

The input schema 230 can represent a file with machine-readable instructions or a declarative format that describes the simulation input parameters, such as required fields, field format, and other aspects. The input schema 230 can include a parameter indicator 245 (e.g., parameter name), parameter type 248, an operating range 251 for the parameters, and potentially other data associated with an input configuration. In some implementations, the input schema 230 can also include documentation describing the purpose of the simulation, the root configuration class used to instantiate services, profiles that should be enabled when using the input schema 230, if any, and other suitable data. In some examples, the input schema 230 can be a JSON schema. However, other schemata can be used. The parameter type 248 can indicate a data type, a data format, and other suitable data characteristics. The operating range 251 can represent a range of possible input values for a configuration parameter.

The output schema 233 can represent a file that is machine-readable and describes the simulation outputs from a simulation. The output schema 233 can include, for example, one or more parameter indicators 245 (e.g., parameter names), queries 254, descriptions 257 associated with the parameters, and other potential data associated with the simulation outputs. The queries 254 can describe how to extract parameter values of the simulation project 227 from the raw simulation output data 242 produced by the simulation. In some implementations, the queries 254 (e.g., structured query language (SQL) queries) can be used to calculate a parameter value from the simulation output data 242. The description 257 can represent a machine-readable data that describes relationships among the simulation outputs (or parameter values), such as a ranking among of the simulation outputs according to a criteria. For example, the ranking or the criteria may be used by the simulator prediction service 221 to select a subset of simulation output data 242 to use for training a machine learning model. In this context, the ranking or criteria may be intended to ensure the most critical parameters are selected or heavily weighted. Additionally, the selected subset of the simulation output data 242 can represent a selection of all of the output parameter values or a selection of a portion of the output parameter values The description 257 may also include instructions or criteria for displaying the parameters in the configurator user interface 103. For instance, the description 257 may include instructions for an order of displaying the parameters, parameter units associated with an operating range for the parameters, and other suitable data. The description 257 can also include text that is displayed on the configurator user interface 103.

The client device 206 is representative of a plurality of client devices that may be coupled to the network 209. The client device 206 may comprise, for example, a processor-based system such as a computer system. Such a computer system may be embodied in the form of a desktop computer, a laptop computer, personal digital assistants, cellular telephones, smartphones, set-top boxes, music players, web pads, tablet computer systems, game consoles, electronic book readers, or other devices with like capability. The client device 206 may include a display. The display may comprise, for example, one or more devices such as liquid crystal display (LCD) displays, gas plasma-based flat panel displays, organic light emitting diode (OLED) displays, electrophoretic ink (E ink) displays, LCD projectors, or other types of display devices, etc.

The client device 206 may be configured to execute various applications such as a client application 260 and/or other applications. In some non-limiting examples, the client application 260 can execute functionality related to the automatic sampling of a simulation space and generating predictive simulation results. The client application 260 may also be executed in a client device 206, for example, to access network content served up by the computing environment 203 and/or other servers, thereby rendering a user interface 263 (e.g., a simulation launcher user interface 102, configurator user interface 103) on the display. To this end, the client application 260 may comprise, for example, a browser, a dedicated application, etc., and the user interface may comprise a network page, an application screen, etc. The client device 206 may be configured to execute applications beyond the client application 260 such as, for example, email applications, social networking applications, word processors, spreadsheets, and/or other applications.

Next, a general description of the operation of the various components of the networked environment 200 is provided. To begin, a user may desire to run a simulation project 227 for a proposed system or an arrangement of various components, such as an arrangement of a set of different robotic devices in a factory floor (e.g., air hub campus 112). The user can use the client device 206 to interact with the simulation prediction service 221 in order to select a manifest 236, a set of configuration parameters, a set of values for the configuration parameters, and any other files as needed for the simulation project 227. The simulation prediction service 221 can generate an input data object 223 (e.g., JSON) for the set of configuration parameters. In some embodiments, the simulator prediction service 221 can use the input schema 230 to validate the user-inputs provided for the input data object 223.

The simulator prediction service 221 can transmit a request to the simulator service 215 to launch a simulation of the simulation project 227. The request may be a simulation API request associated with the simulator service 215. The request can include the manifest 236, the input data object 223, and any other suitable files.

The simulator service 215 can execute one or more simulations based on the provided inputs. The simulator service 215 can generate the simulation output data 242 for the simulations. The simulation output data 242 can be stored in the data store 212. In some embodiments, a portion of the simulation output data 242 can be used for training a machine learning model (via the machine learning service 218).

In some embodiments, the simulator prediction service 221 can display the simulated values on a configurator user interface 103. The simulator prediction service 221 can display the simulated values according to the output schema 233. Additionally, the simulator prediction service 221 can calculate the simulated values based on instructions in the output schema 233.

The user can adjust one or more user interface components to request one or more parameter values on an unsimulated input configuration, which may be a set of configuration parameters that have not been simulated. Once the user interface components are set, the unsimulated input configuration can be included in a query to the machine learning model. The machine learning model can provide a predictive simulation result based on the set of configuration parameters.

Figure 3:
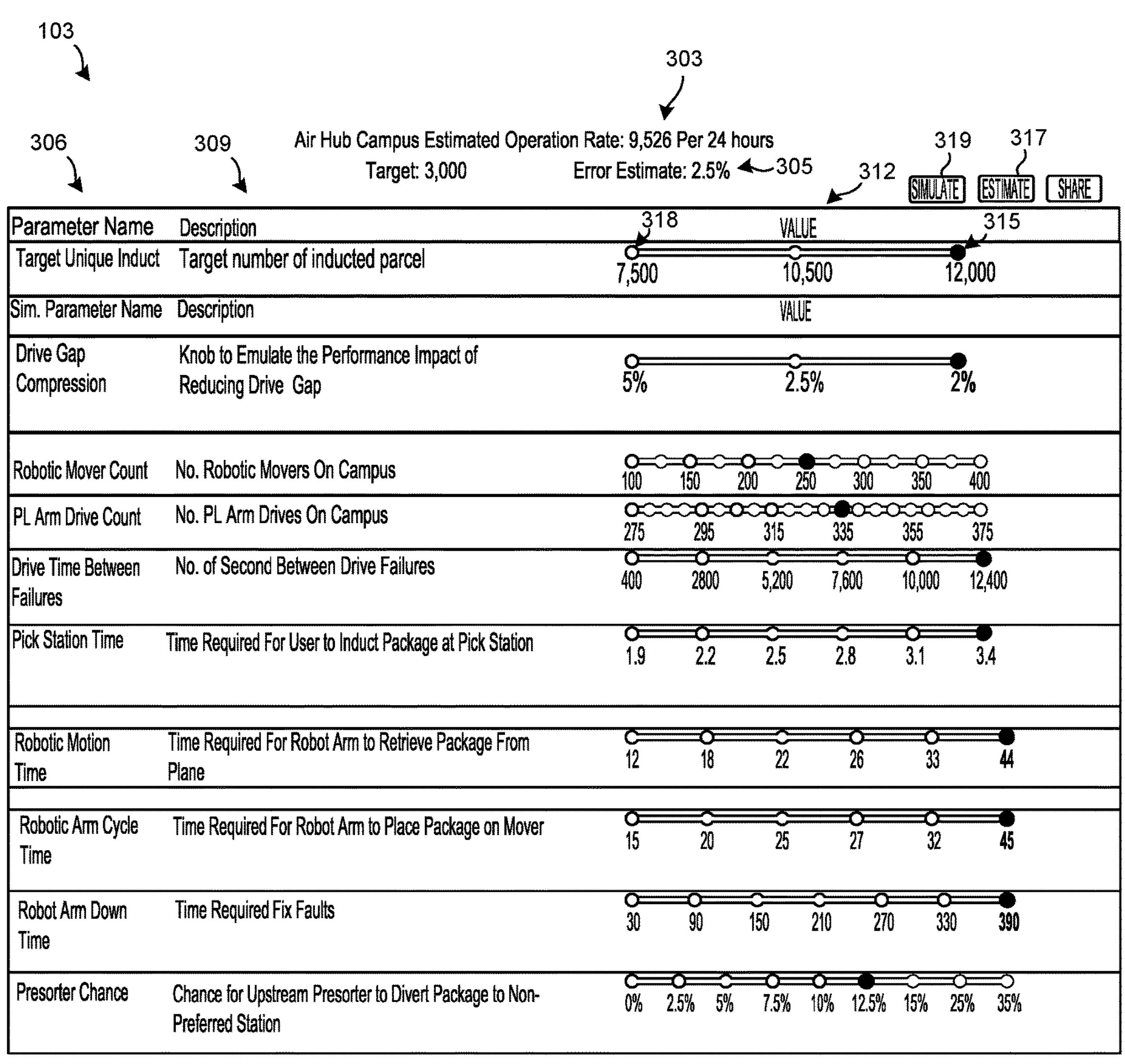
FIG. 3 is a drawing of an example user interface displayed by a client device in the networked environment of FIG. 2 according to various embodiments of the present disclosure.

Referring next to FIG. 3, shown is an example of a configurator user interface 103. The configurator user interface 103 includes a displayed parameter value 303, which can represent a predictive simulator output or a simulated value based on the input parameters that have been selected.

The configurator user interface 103 displays an error estimate 305, a parameter name 306, a parameter description 309, and a set of input values 312 for the parameter. These data items can be extracted from the output schema 233.

When the displayed parameter value 303 is a predictive simulator output, it is derived and displayed based on a machine learning model that has been trained on simulation output data 242. The simulator prediction service 221 can query the machine learning service 218 with the set of input values 312 that have not been simulated. The simulator prediction service 221 can receive the displayed parameter value 303 (i.e., a predictive simulator output) and have it displayed on the configurator user interface 103. The error estimate 305 can be associated with the displayed parameter value 303. The error estimate 305 can also represent a confidence level in the displayed parameter value 303. As such, when the displayed parameter value 303 is a predictive simulator output the error estimate 305 is likely to be higher than a simulated value.

A user can adjust the set of input values 312 to a different arrangement. This different arrangement can be transmitted to the trained machine learning model (via the machine learning service 218) as a second input configuration after a user clicks on the "Estimate" button 317. The machine learning model can respond with an updated displayed parameter value 303 (e.g., a second predictive value), which may be updated in in real-time (or near real-time). For example, the darken circles 315 can represent selected parameters that are unsimulated and selected for a present input configuration. The present input configuration has generated a displayed parameter value 303, which is a predictive simulator output. The empty circles 318 can represent input parameters have were simulated. As noted previously, the input parameters that were simulated can generate simulation output data 242, and the simulated output data 242 can be used for training a machine learning model.

Further, the configurator user interface 103 can also launch a simulation of a set of input parameter values by clicking on the "Simulate" button 319. For example, after reviewing the displayed parameter values 303 that are predictive for various input configurations, a user may desire to simulate a set of input parameters that it is believed to be the preferred configuration of an implementation. As such, a user may want to simulate the preferred input parameters because an actual simulation of the input parameters will likely be more accurate than a predictive simulator output or value. Thus, the simulated input parameters will have a lower error estimate 305 than the unsimulated input parameters. As such, the embodiments reduce the number of simulations that are needed for a user. Additionally, the configurator user interface 103 can provide a single user interface for generating simulating results and generating predictive simulated results. Thus, a user does not have to navigate to a separate application or user interface for simulating or generating predictive results that would require additional time to load parameters and input files.

After a set of input parameters have been simulated from a user clicking on the "Simulate" button 319, the simulator prediction service 221 can generate an input data object 223 to include the selected input parameters and the displayed parameter value 303 from the configurator user interface 103. The input data object 223 can be sent to the simulator service 215 in order to initiate a simulation. After the simulation has been completed, the configurator user interface 103 can provide an update to the displayed parameter value 303 and the error estimate 305. Additionally, the input parameters will be updated from a darken circle 315 to an empty circle 318 upon receiving the simulation output data 242 and/or the updated displayed parameter value 303.

Figure 4:
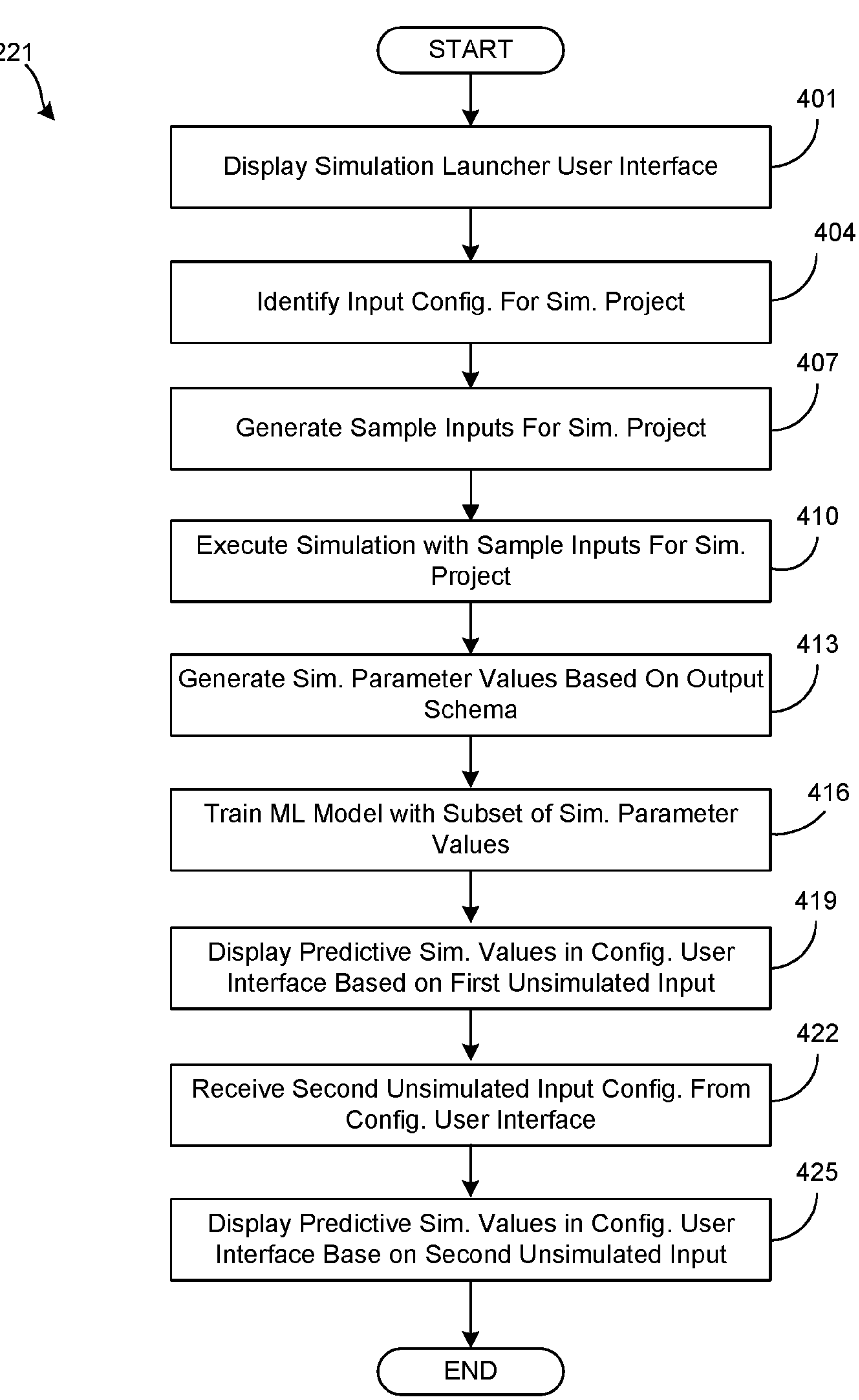
FIG. 4 is a flowchart illustrating one example of functionality implemented as portions of a service executed in the computing environment employed in the networked environment of FIG. 2 according to various embodiments of the present disclosure.

Referring next to FIG. 4, shown is a flowchart that provides one example of the operation of a portion of the simulator prediction service 221 according to various embodiments. It is understood that the flowchart of FIG. 4 provides merely an example of the many different types of functional arrangements that may be employed to implement the operation of the portion of the simulator prediction service 221 as described herein. The flowchart of FIG. 4, in part or as a whole, can be performed by other services and applications. As an alternative, the flowchart of FIG. 4 may be viewed as depicting an example of elements of a method implemented in the computing environment 203 (FIG. 2) according to one or more embodiments.

Beginning with box 401, the simulator prediction service 221 can display a simulation launcher user interface 102 on a client device 206. In some embodiments, the simulation launcher user interface 102 can be a simplified web frontend for launching new simulation projects 227. The simulation launcher user interface 102 can operate as a user-friendly version of the simulator service 215. Some simulator services 215 can be confusing to install and use for those unfamiliar with a command line interface. In the simulation launcher user interface 102, a user can select a simulation manifest (e.g., manifest 236) and the user is shown the possible parameter values that they can provide, along with their description. A user can also view information stored in the manifest repository 224 such as the maintenance status of the simulation, and whether it is supported. In an alternative embodiment, the configurator user interface 103 can be used to initiate a launch of a simulation by selecting a manifest 236, configuration parameters, parameter values, and other input files.

In box 404, the simulator prediction service 221 can identify an input configuration for a simulation project 227 from one or more selections and entries received by the simulation launcher user interface 102. The selected input configuration can include receiving a manifest 236 and an input data object 223 for executing the simulation project 227. The input data object 223 can be generated to include configuration parameters and input parameter values that have been selected by the user. In some embodiments, the input data object 223 is JavaScript Object Notation (JSON). However, one skilled in the art understands that other data structures or data interchange formats can be used.

In some embodiments, the input data object 223 (e.g., JSON) is "flattened" to make querying it easier. This can include default values that were not explicitly supplied by the user. Additionally, to provide ease of use, in some examples, the simulator prediction service 221 can create a new parquet file where the input parameter values are the scalar values of the configuration, and the columns are based on the paths to those values.

In box 407, the simulator prediction service 221 can generate sample inputs for the simulation project 227. The sample inputs are intelligently selected in order to provide the best representation of the sample space for the simulation project 227. As previous indicated, the simulator prediction service 221, given a manifest 236, can generate a sweep over that simulation project 227 using a configurable sampling strategy. The sweep will launch much fewer simulations than a brute-force search over the sample space, while maintaining a similar level of sensitivity. The goal of this step can be to make a "one-click" sweep launcher, so that non-data-scientist members of the team can easily launch robust, cost-effective, sweeps of the sample space by supplying a manifest 236 and a desired number of simulation runs.

There are various sampling methods and sampling techniques for generating sample inputs based on various factors for the simulation project 227. For example, a sampling technique can be determined based on a sampling space criteria for the simulation project 227. Some non-limiting examples of sampling space criteria may include a level of desired granularity, a desired number of sample inputs, a simulation execution time constraint, an operational range of a parameter, a parameter type, and other suitable factors associated with the sample space for the simulation project 227.

After the sampling technique has been selected, it can be used to generate a set of sample inputs for the sample space given a manifest 236. Some non-limiting examples of sampling techniques can include Sobol Sampling, Elementary Effects Sampling, Brute Force Sampling (e.g., sample every 5 units), Latin Hypercube Sampling and other suitable sampling techniques. By intelligently selecting a sampling technique and sample inputs, the simulator prediction service 221 can minimize the quantity of simulations needed for training a machine learning model. As such, these factors can affect the quality of the training data for the machine learning model.

In box 410, the simulator prediction service 221 can execute a simulation of the simulation project 227 based on the selected sample inputs, the manifest 236, and the input data object 223. A non-limiting example of a simulator or simulator service may be a discrete-event simulator. In some embodiments, the client device 206 can provide (e.g., via the simulation launcher user interface 102) the simulator prediction service 221 with a versioned manifest 236, an input data object 223 (e.g., JSON), and auxiliary input files. The simulator prediction service 221 can initiate the simulation launch by using simulation APIs of the simulator service 215. The user may also supply additional metadata tags for the individual simulation run, such as a sweep name.

In box 413, the simulator prediction service 221 can generate simulation output parameter values based on the output schema 233. After one or more simulations have been completed, the simulation output data 242 is stored in the data store 212. In some embodiments, the simulator prediction service 221 can calculate an output parameter value of a simulation based on instructions in the output schema 233. For example, an output parameter value can be calculated based on executing a parameter SQL query for the simulation output data 242, in which the parameter SQL query is stored in the output schema 233.

In box 416, the simulator prediction service 221 can train a machine learning model with a subset of the output parameter values. In some embodiments, the subset of parameter values from the simulation can be selected based on the output schema 233, which can indicate the most important parameter values, a ranking of parameters in order of importance, a selection criteria, or other suitable ways for indicating a selection of a parameter values. The selected subset of the output parameter values can represent a selection of all the output parameter values or a selection of a portion of the output parameter values.

In some embodiments, after the machine learning model has been trained, it may be reviewed for accuracy. The review can be done manually by an operator. In some cases, the machine learning model can be verified in an automated manner using a plurality of test points that are not associated with the sample inputs selected earlier. After the machine learning model has been validated, the simulator prediction service 221 can proceed to box 419.

In box 419, the simulator prediction service 221 can display or render a configurator user interface 103. The configurator user interface 103 can include one or more predictive simulation values (i.e. the displayed parameter value 303) based on a first unsimulated input. The first unsimulated input can represent one or more configuration parameters that have not been simulated. The configurator user interface 103 can also include user interface components (e.g., a slider, a drop-down menu, selectable icons) for selecting input parameter values to constitute the first unsimulated input.

The predictive simulation values (i.e. the displayed parameter value 303) can be generated by transmitting a query to the machine learning model (via the machine learning service 218) with the first unsimulated input. The machine learning model can provide the predictive simulation values, which can be displayed on the configurator user interface 103. In some embodiments, the configurator user interface 103 can indicate a simulated input configuration from the simulated input configurations. Further, in some embodiments, for a given unsimulated input configuration, the configurator user interface 103 can display a confidence score or a degree of uncertainty associated with the predictive simulation values.

In box 422, the simulator prediction service 221 can receive a second unsimulated input configuration. As indicated above, an operator can manipulate the user interface components to select a different set of configuration parameters that have not been simulated. The different set of configuration parameters can be identified and a request can be transmitted to the machine learning model with this second unsimulated input configuration. The machine learning model can provide a second predictive simulated result based on the second unsimulated input configuration.

In box 425, the simulator prediction service 221 can update the configurator user interface 103 to display the second unsimulated input configuration. As one can appreciated, the operator of the configuration user interface 103 can generate numerous unsimulated input configurations. In response, the configurator user interface 103 can update with a new predictive simulation value (i.e. the displayed parameter value 303) in response to the new unsimulated input configuration. Then, the simulator prediction service 221 can proceed to the end.

Figure 5:
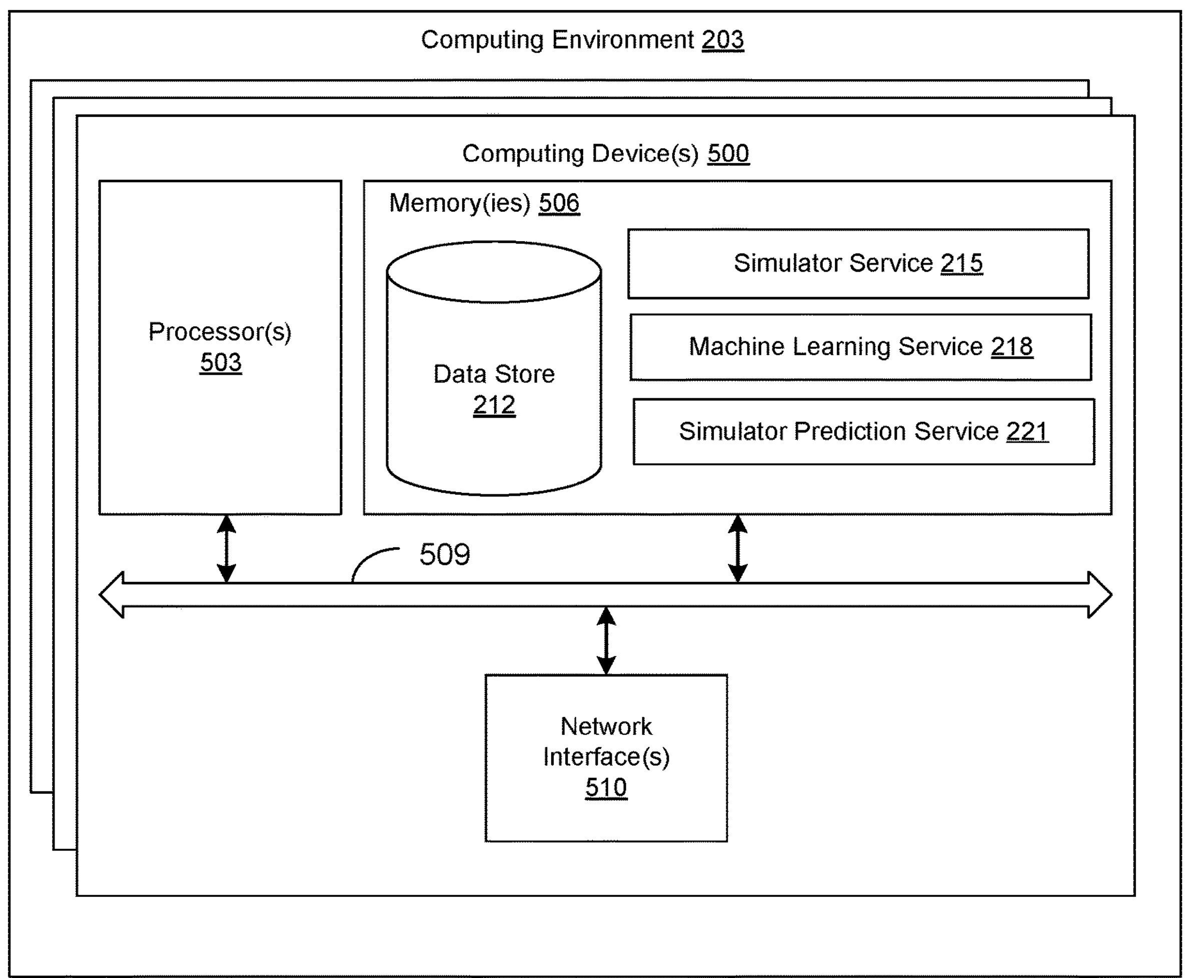
FIG. 5 is a schematic block diagram that provides one example illustration of the computing environment employed in the networked environment of FIG. 2 according to various embodiments of the present disclosure.

With reference to FIG. 5, shown is a schematic block diagram of the computing environment 203 according to an embodiment of the present disclosure. The computing environment 203 includes one or more computing devices 500. Each computing device 500 includes at least one processor circuit, for example, having a processor 503 and a memory 506, both of which are coupled to a local interface 509. To this end, each computing device 500 may comprise, for example, at least one server computer or like device. The local interface 509 may comprise, for example, a data bus with an accompanying address/control bus or other bus structure as can be appreciated. A network interface 510 can access for the local interface 509.

Stored in the memory 506 are both data and several components that are executable by the processor 503. In particular, stored in the memory 506 and executable by the processor 503 are simulator service 215, machine learning service 218, and simulator prediction service 221, and potentially other applications. Also stored in the memory 506 may be a data store 212 and other data. In addition, an operating system may be stored in the memory 506 and executable by the processor 503.

It is understood that there may be other applications that are stored in the memory 506 and are executable by the processor 503 as can be appreciated. Where any component discussed herein is implemented in the form of software, any one of a number of programming languages may be employed such as, for example, C, C++, C#, Objective C, Java®, JavaScript®, Perl, PHP, Visual Basic®, Python®, Ruby, Flash®, or other programming languages.

A number of software components are stored in the memory 506 and are executable by the processor 503. In this respect, the term "executable" means a program file that is in a form that can ultimately be run by the processor 503. Examples of executable programs may be, for example, a compiled program that can be translated into machine code in a format that can be loaded into a random access portion of the memory 506 and run by the processor 503, source code that may be expressed in proper format such as object code that is capable of being loaded into a random access portion of the memory 506 and executed by the processor 503, or source code that may be interpreted by another executable program to generate instructions in a random access portion of the memory 506 to be executed by the processor 503, etc. An executable program may be stored in any portion or component of the memory 506 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The memory 506 is defined herein as including both volatile and nonvolatile memory and data storage components. Volatile components are those that do not retain data values upon loss of power. Nonvolatile components are those that retain data upon a loss of power. Thus, the memory 506 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Also, the processor 503 may represent multiple processors 503 and/or multiple processor cores and the memory 506 may represent multiple memories 506 that operate in parallel processing circuits, respectively. In such a case, the local interface 509 may be an appropriate network that facilitates communication between any two of the multiple processors 503, between any processor 503 and any of the memories 506, or between any two of the memories 506, etc. The local interface 509 may comprise additional systems designed to coordinate this communication, including, for example, performing load balancing. The processor 503 may be of electrical or of some other available construction.

Although the simulator service 215, the machine learning service 218, the simulator prediction service 221, and other various systems described herein may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits (ASICs) having appropriate logic gates, field-programmable gate arrays (FPGAs), or other components, etc. Such technologies are generally well known by those skilled in the art and, consequently, are not described in detail herein.

The flowchart of FIG. 4 show the functionality and operation of an implementation of portions of the simulator prediction service 221. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor 503 in a computer system or other system. The machine code may be converted from the source code, etc. If embodied in hardware, each block may represent a circuit or a number of interconnected circuits to implement the specified logical function(s).

Although the flowchart of FIG. 4 show a specific order of execution, it is understood that the order of execution may differ from that which is depicted. For example, the order of execution of two or more blocks may be scrambled relative to the order shown. Also, two or more blocks shown in succession in FIG. 4 may be executed concurrently or with partial concurrence. Further, in some embodiments, one or more of the blocks shown in FIG. 4 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein, including the simulator service 215, the machine learning service 218, the simulator prediction service 221, that comprises software or code can be embodied in any non-transitory computer-readable medium for use by or in connection with an instruction execution system such as, for example, a processor 503 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system.

The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

Further, any logic or application described herein, including the simulator service 215, the machine learning service 218, the simulator prediction service 221, may be implemented and structured in a variety of ways. For example, one or more applications described may be implemented as modules or components of a single application. Further, one or more applications described herein may be executed in shared or separate computing devices or a combination thereof. For example, a plurality of the applications described herein may execute in the same computing device 500, or in multiple computing devices in the same computing environment 203. Additionally, it is understood that terms such as "application," "service," "system," "engine," "module," and so on may be interchangeable and are not intended to be limiting.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, the following is claimed:

1. A non-transitory computer-readable medium comprising machine-readable instructions that, when executed by a processor of a computing device, cause the computing device to at least:

receive, via a user interface, a user selection of a manifest and first input data object for determining a quantity of packages that can be processed through an air hub campus in a first period of time, the manifest being linked to an image identifier for an instance of simulation source code, the first input data object comprising a first plurality of configuration parameters and a first plurality of parameter values for one or more robotic devices that are configured to handle packages at the air hub campus;

generate, based on the first input data object, a plurality of sample inputs for determining the quantity of packages, based at least in part on a sampling space criteria;

determine a plurality of simulation outputs based at least in part on the plurality of sample inputs, the manifest, and the first input data object;

train a machine learning model based at least in part on the plurality of simulation outputs;

receive, via the user interface, second input data object including a second plurality of configuration parameters and a second plurality of parameter values for the one or more robotic devices;

determine, based on the second input data object and using the machine learning model, a predictive simulator output comprising an estimate of a number of packages that can be processed through the air hub campus using the one or more robotic devices; and cause the user interface to display the predictive simulator output in real time.

2. The non-transitory computer-readable medium of claim 1, wherein the one or more robotic devices comprise at least one of a quantity of robotic package movers or a number of robotic arms.

3. The non-transitory computer-readable medium of claim 1, wherein training the machine learning model further comprises:

selecting a subset of the plurality of simulation outputs based at least in part on an output schema associated with the manifest, wherein the machine learning model is trained using the subset of the plurality of simulation outputs.

4. The non-transitory computer-readable medium of claim 1, wherein the plurality of sample inputs are generated based at least in part on determining a sampling technique using the sampling space criteria.

5. A system, comprising:

a computing device comprising a processor and a memory; and machine-readable instructions stored in the memory that, when executed by the processor, cause the computing device to at least:

receive, via a user interface, first input data object for determining a quantity of packages that can be processed at an air hub campus by one or more robotic devices in a first period of time, the first input data object comprising a plurality of configuration parameters and a plurality of parameter values associated with the one or more robotic devices;

generate, based on the first input data object, a plurality of sample inputs;

generate a plurality of simulation outputs based at least in part on the plurality of sample inputs, and the first input data object;

train a machine learning model based at least in part on the plurality of simulation outputs;

receive, via the user interface, a second input data object, the second input data object including a second plurality of configuration parameters and a second plurality of parameter values associated with the one or more robotic devices;

determine, based on the second input data object and the machine learning model, a predictive simulator output comprising an estimated number of packages that can be processed by the one or more robotic devices in a second period of time; and cause the user interface to display the predictive simulator output in real time.

6. The system of claim 5, wherein the one or more robotic devices comprises at least one of a quantity of robotic package movers and a number of robotic arms.

7. The system of claim 5, wherein training the machine learning model further comprises:

selecting a subset of the plurality of simulation outputs based at least in part on an output schema associated with a manifest, wherein the machine learning model is trained using the subset of the plurality of simulation outputs.

8. The system of claim 7, wherein the output schema comprises a parameter criteria for selecting the subset of the plurality of simulation outputs.

9. The system of claim 5, wherein the machine readable instructions further cause the computing device to: determine a first quantity of robotic movers or a first quantity of robotic arms to deploy in the air hub campus to process the estimated number of packages.

10. The system of claim 5, wherein the machine-readable instructions, when executed by the processor, cause the computing device to at least:

display the user interface for selecting the second plurality of configuration parameters for the simulation project, wherein the second input data object is identified based at least in part on the selection of the second plurality of configuration parameters.

11. A method, comprising:

receiving, by a computing system, a request to determine a quantity of packages that can be processed using one or more robotic devices in an air hub campus in a first period of time;

generating, by a computing device based on the request, a first input data object, the input data object comprising a first plurality of configuration parameters and a first plurality of parameter values associated with the one or more robotic devices;

generating, by the computing device using the first input data object, a plurality of sample inputs;

generating, by the computing device, a plurality of simulation outputs based at least in part on the plurality of sample inputs, and the first input data object;

training, by the computing device, a machine learning model based at least in part on the plurality of simulation outputs;

receiving, by the computing system, a second input data object, the second input data object including a second plurality of configuration parameters and a second plurality of parameter values associated with the one or more robotic devices;

determining, based on the second input data object and using the machine learning model, a predictive simulator output comprising an estimated number of packages that can be processed by the one or more robotic devices in the first period of time; and causing a user interface to display the predictive simulator output in real time.

12. The method of claim 11, wherein the plurality of configuration parameters comprises at least one of a quantity of the one or more robotic devices, wherein the one or more robotic devices include robotic package movers, or a number of robotic arms.

13. The method of claim 11, wherein the user interface comprises a user interface component associated with one of the first plurality of configuration parameters.

14. The method of claim 11, wherein training the machine learning model further comprises:

selecting a subset of the plurality of simulation outputs based at least in part on an output JavaScript Object Notation (JSON) schema associated with a manifest, wherein the machine learning model is trained using the subset of the plurality of simulation outputs.

15. The method of claim 14, wherein the manifest and the plurality of configuration parameters are selected from a simulation launcher user interface.

16. The method of claim 11, wherein the first input data object is a JSON object.

* * * * *